(12) United States Patent
Friedman et al.

(10) Patent No.: US 10,594,319 B2
(45) Date of Patent: Mar. 17, 2020

(54) SYSTEM AND METHOD FOR COMPLIMENTARY VT-DROP AMBIPOLAR CARBON NANOTUBE LOGIC

(71) Applicant: Northwestern University, Evanson, IL (US)

(72) Inventors: Joseph S. Friedman, Rochester, NY (US); Michael L. Geier, Chicago, IL (US); Mark C. Hersam, Wilmette, IL (US); Alan V. Sahakian, Northbrook, IL (US)

(73) Assignee: Northwestern University, Evanston, IL (US)

( * ) Notice: Subject to any disclaimer, the term of this patent is extended or adjusted under 35 U.S.C. 154(b) by 143 days.

(21) Appl. No.: 15/591,833

(22) Filed: May 10, 2017

(65) Prior Publication Data
US 2019/0013810 A1 Jan. 10, 2019

Related U.S. Application Data

(60) Provisional application No. 62/345,247, filed on Jun. 3, 2016.

(51) Int. Cl.
| | | |
|---|---|---|
| *H03K 19/21* | (2006.01) | |
| *H03K 19/082* | (2006.01) | |
| *G06F 7/501* | (2006.01) | |
| *H01L 51/05* | (2006.01) | |
| *H01L 51/00* | (2006.01) | |

(52) U.S. Cl.
CPC .......... *H03K 19/082* (2013.01); *G06F 7/501* (2013.01); *H01L 51/0554* (2013.01); *H03K 19/212* (2013.01); *H01L 51/0048* (2013.01)

(58) Field of Classification Search
CPC ...... H03K 19/20; H03K 19/21; H03K 19/212; H03K 19/215; H03K 17/51; H03K 17/56; H03K 17/567; H03K 17/6257; H03K 17/687; H03K 17/6871; H03K 17/6872; H03K 17/6874; H03K 17/6877; H03K 2017/6875; H03K 2017/6878
See application file for complete search history.

(56) References Cited

U.S. PATENT DOCUMENTS

| | | | |
|---|---|---|---|
| 7,795,907 B1* | 9/2010 | Wang | H01L 27/0924 326/104 |
| 2007/0102747 A1* | 5/2007 | Chen | B82Y 10/00 257/314 |

(Continued)

OTHER PUBLICATIONS

Y. Lin, J. Appenzeller, J. Knoch, and P. Avouris, "High-performance carbon nanotube field-effect transistor with tunable polarities," IEEE Trans. Nanotechnol., vol. 4, No. 5, pp. 481-489, 2005.

(Continued)

*Primary Examiner* — Jason Crawford
(74) *Attorney, Agent, or Firm* — Benesch, Friedlander, Coplan & Aronoff LLP

(57) ABSTRACT

A logic gate and a cascaded logic family is described that uses the unique ambipolar behavior, e.g., of carbon nanotubes. A complementary VT-drop ambipolar carbon nanotube logic can provide a decrease in device count compared to previous ambipolar carbon nanotube field effect transistor logic structures, enabling power and/or speed improvements.

31 Claims, 4 Drawing Sheets

(56) References Cited

U.S. PATENT DOCUMENTS

| | | | |
|---|---|---|---|
| 2008/0143389 A1* | 6/2008 | Keshavarzi | B82Y 10/00 326/112 |
| 2010/0155707 A1* | 6/2010 | Anthopoulos | B82Y 10/00 257/40 |
| 2010/0315128 A1* | 12/2010 | Kapoor | H01L 29/8086 326/112 |
| 2012/0049890 A1* | 3/2012 | Keshavarzi | B82Y 10/00 326/112 |
| 2012/0273763 A1* | 11/2012 | Banerjee | H01L 49/003 257/39 |
| 2013/0021061 A1* | 1/2013 | Bjoerk | H01L 29/42312 326/54 |
| 2013/0313524 A1 | 11/2013 | De Micheli et al. | |
| 2014/0043060 A1* | 2/2014 | Amaru | H03K 19/20 326/36 |
| 2014/0292381 A1* | 10/2014 | Appenzeller | H01L 29/1606 327/119 |
| 2015/0380523 A1* | 12/2015 | Hekmatshoartabari | H01L 27/1222 438/166 |
| 2018/0175193 A1* | 6/2018 | Raghavan | H01L 29/7827 |

OTHER PUBLICATIONS

S. Z. Bisri, J. Gao, V. Derenskyi, W. Gomulya, I. Iezhokin, P. Gordiichuk, A. Herrmann, and M. A. Loi, "High performance ambipolar field-effect transistor of random network carbon nanotubes," Adv. Mater., vol. 24, pp. 6147-6152, 2012.

M. H. Ben-Jamaa, K. Mohanram, and G. De Micheli, "An efficient gate library for ambipolar CNTFET logic," IEEE Trans. CAD, vol. 30, No. 2, pp. 242-255, Feb. 2011.

M. De Marchi, D. Sacchetto, S. Frache, J. Zhang, P. E. Gaillardon, Y. Leblebici, and G. De Micheli, "Polarity control in double-gate, gate-all-around vertically stacked silicon nanowire FETs," in IEDM, 2012, pp. 183-186.

D. Sacchetto, Y. Leblebici, and G. De Micheli, "Ambipolar gate-controllable SiNW FETs for configurable logic circuits with improved expressive capability," IEEE Electron Device Lett., vol. 33, No. 2, pp. 143-145, 2012.

J. Zhang, X. Tang, P.-E. Gaillardon, and G. De Micheli, "Configurable circuits featuring dual-threshold-voltage design with three-independent-gate Silicon nanowire FETs," IEEE Trans. Circuits Syst. I, vol. 61, No. 10, pp. 2851-2861, 2014.

M. De Marchi, J. Zhang, S. Frache, D. Sacchetto, P.-E. Gaillardon, Y. Leblebici, and G. De Micheli, "Configurable logic gates using polarity controlled silicon nanowire gate-all-around FETs," IEEE Electron Device Lett., vol. 35, No. 8, pp. 880-882, 2014.

J. Trommer, A. Heinzig, S. Slesazeck, T. Mikolajick, and W. M. Weber, "Elementary aspects for circuit implementation of reconfigurable nanowire transistors," IEEE Electron Device Lett., vol. 35, No. 1, pp. 141-143, 2014.

J. Trommer, A. Heinzig, T. Baldauf, S. Slesazeck, T. Mikolajick, and W. M. Weber, "Functionality-enhanced logic gate design enabled by symmetrical reconfigurable silicon nanowire transistors," IEEE Trans. Nanotechnol., vol. 14, No. 4, pp. 689-698, 2015.

\* cited by examiner

SYSTEM AND METHOD FOR COMPLIMENTARY VT-DROP AMBIPOLAR CARBON NANOTUBE LOGIC

CROSS-REFERENCE TO RELATED APPLICATIONS

This patent application claims the benefit of U.S. Provisional Patent Application No. 62/345,247, filed on Jun. 3, 2016, the entire contents of which is incorporated by reference in its entirety.

STATEMENT OF FEDERALLY FUNDED RESEARCH OR SPONSORSHIP

This invention was made with government support under N00014-11-1-0690 awarded by the Office of Naval Research and DMR1121262 awarded by the National Science Foundation. The government has certain rights in the invention.

BACKGROUND

Ambipolar carbon nanotubes (CNTs) have attracted attention for beyond-CMOS computing. Previous efforts may not have taken advantage of ambipolar field effect transistors (FETs). In one example, two parallel ambipolar transistors are used for each set of input signals in order to ensure full voltage swing at each stage. Alternatively, logic gates are presented that cannot be directly cascaded.

DESCRIPTION

Figure 1:
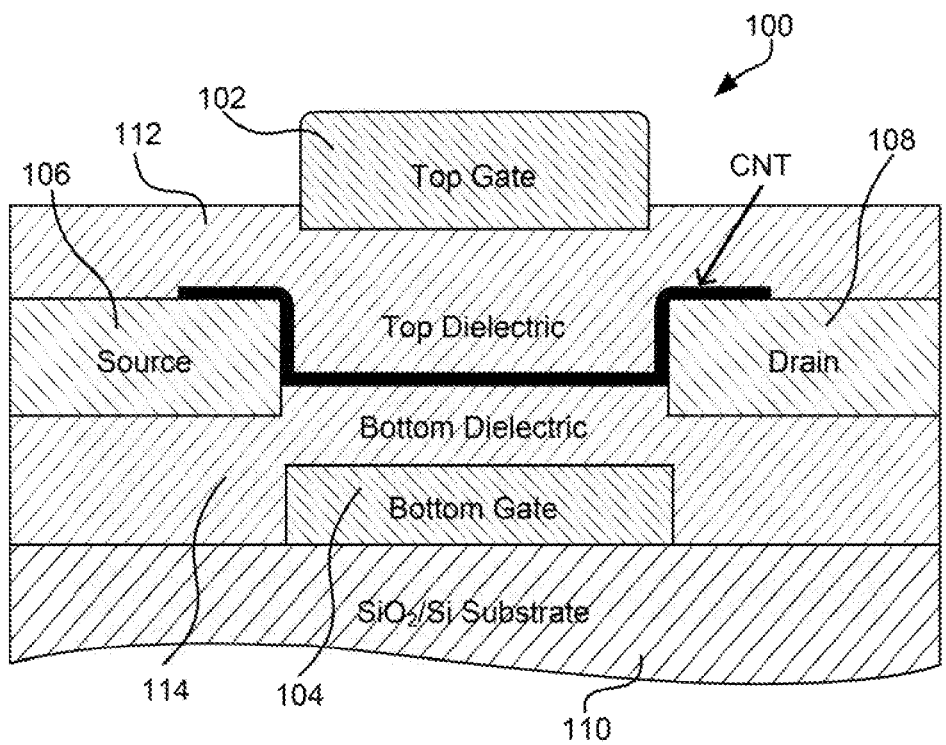
FIG. 1 is a schematic cross section of an example 2-input ambipolar CNT FET.

A cascaded logic family is described that uses an ambipolar behavior of ambipolar devices, e.g., carbon nanotubes (CNT's). While CNT's are discussed for the sake of explanation, other ambipolar device types, including silicon nanowires, can be used. The complementary VT-drop ambipolar CNT logic can provide about a 50%-75% decrease in device count compared to previous ambipolar CNT FET logic structures, enabling power and speed improvements. A mechanism is applied to permit the cascading of logic gates, providing features that make the logic family a contender to replace CMOS in the next generation of computing. To maximize the efficiency of the logic structure, the device count is reduced by removing the requirement of a full voltage swing for each logic gate. A slightly higher supply voltage is therefore used to overcome the decreased noise margin. The fabrication is simplified and the robustness is increased through the use of a random network of CNTs with bottom and top gates that can be shared by complementary pairs of ambipolar FETs.

Introduction

As the scaling of Si complementary metal oxide semiconductor (CMOS) field-effect transistor (FET) logic circuits approaches its physical limits, further increases in computer hardware efficiency comes from improvements of the switching devices and the logic structure. Single-walled carbon nanotubes (CNTs) can be attractive due to their high mobility and large bandgaps, and several distinct strategies exploit CNTs as a logical switching device. Most efforts have used CNT FETs as unipolar electrical switches that provide similar functionality to conventional CMOS FETs. In such schemes, CNT FETs simply replace MOS FETs without modifying the logic structure. Some CNT logic circuits use CNT FETs that take on n- or p-type characteristics depending on their position in the circuit, while others use metal work functions to determine polarity, transmission gate logic, or pseudo-CMOS logic with only a single FET polarity.

The ambipolar transport present in CNT FETs has led to the development of a logic family for ambipolar devices such as CNT and Si nanowire FETs. The systems, methods and logic can use two independently addressable gates for each ambipolar FET, in contrast to the use of only one in the conventional unipolar FET systems. This additional control provides the ability to perform complex computations with fewer devices and logic stages. To ensure full voltage swing at each logic stage, pairs of ambipolar FETs have been used for each set of input signals. This is an expensive and structurally complex method for ensuring signal integrity.

Referring to the Figures, a complementary ambipolar CNT logic family is described that can reduce the device count by abandoning the requirement of full voltage swing. This can enable a decrease in device count by a factor between two and four, as there are half as many FETs in each logic stage and fewer complementary signals are required. Example progress toward the realization of the logic family is presented, and its potential use in compact logic circuits is evaluated.

Dual-Gate Ambipolar CNT Transistor

FIG. 1 is a schematic cross section of an example 2-input ambipolar CNT FET 100. Intrinsic CNT FETs 100 exhibit ambipolar behavior with symmetric electron and hole transport. Two-gate control can be achieved by adding a top dielectric 112 and a bottom dielectric 114, in the schematic cross-section of FIG. 1, including a corresponding top gate 102 and a bottom gate 104. A CNT layer is positioned between the top dielectric 112 and the bottom dielectric 114. One gate 102 or 104 can tune the polarity while the other gate 102 or 104 modulates conductance. For example, the bottom gate 104 can control polarity and the top gate 102 can modulate conductance, or vice versa. As used herein, top and bottom gates and dielectrics can refer to front and back gates and dielectrics, etc. or other configurations of gates and dielectrics. The CNT FET 100 also includes a source 106 and a drain 108 connected with the gates 102, 104. The gates 102, 104, source 106 and drain 108 can be supported by a substrate 110, e.g., a SiO2/Si substrate.

Alternatively, the ambipolar CNT FET 100 can be used to perform the logic function of Table I: when both gates 102, 104 have the same binary voltage value (high or low), the double-gate ambipolar CNT FET 100 is in a highly conductive "ON" state; otherwise, the CNT FET 100 is in a highly resistive "OFF" state.

TABLE I

Dual-Gate Ambipolar CNT Binary Conductance States

| Top Gate Voltage | Bottom Gate Voltage | Conductance State |
|---|---|---|
| Low | Low | ON |
| Low | High | OFF |
| High | Low | OFF |
| High | High | ON |

Figure 2A:
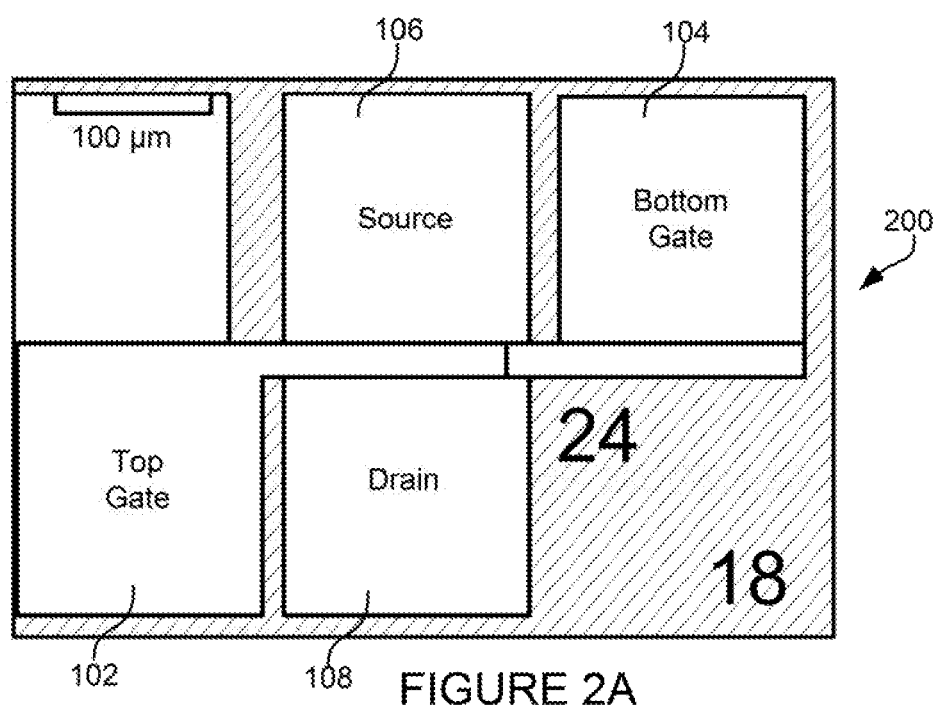
FIG. 2A is an example micrograph of fabricated dual-gate ambipolar CNT FET.
Figure 2B:
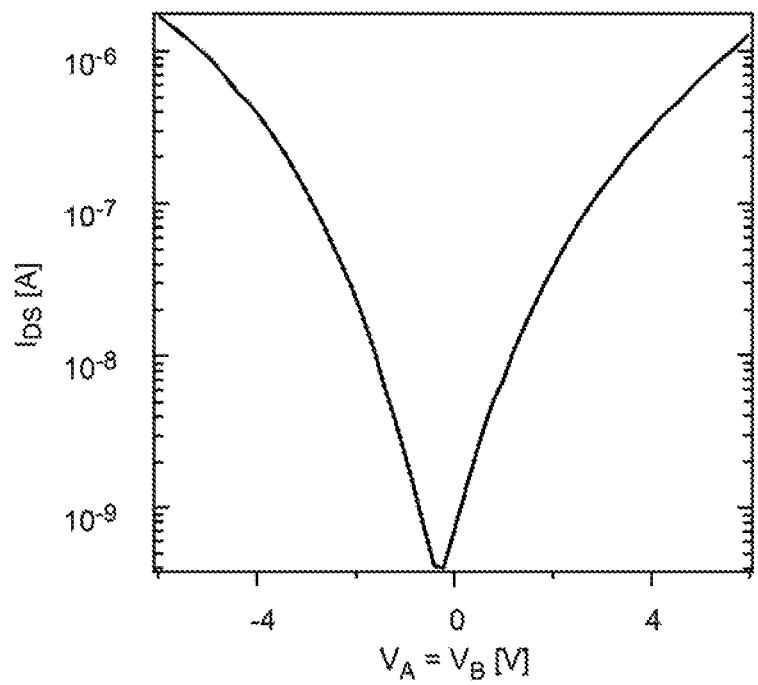
FIG. 2B is an example current-voltage characteristic of dual-gate ambipolar CNT FET for VA=VB.

FIG. 2A is an example micrograph 200 of fabricated dual-gate ambipolar CNT FET 100, and FIG. 2B is an example current-voltage characteristic of dual-gate ambipolar CNT FET 100 for VA=VB. A ~99% semiconducting CNT FETs 100 can be prepared into a random network bottom contact thin-film transistor with symmetric top and bottom gates 102, 104, in the micrograph of FIG. 2A. The CNT FET 100 can include Ni gates 102, 104, Au source/drain contacts 106, 108, and Al2O3 gate dielectrics. Other chemical elements can be used. An example ambipolar behavior of the dual-gate CNT FET 100 is demonstrated in FIG. 2B: when both gate 102, 104 voltages are at an intermediate level with a small magnitude, the CNT FET 100 is in a resistive state; when the gate 102, 104 voltages are both negative or both positive, the CNT FET is in a conductive state.

Complementary VT-Drop Ambipolar Logic Gate

Figure 3:
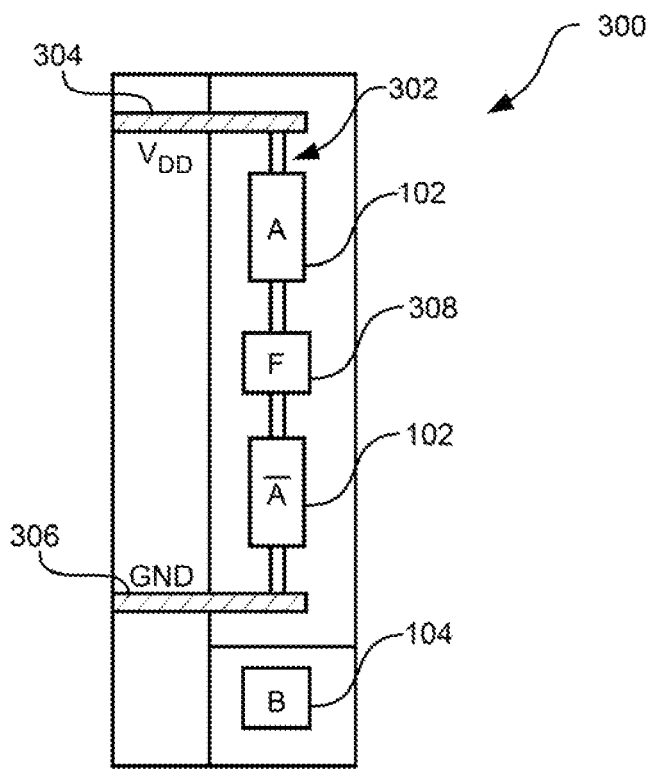
FIG. 3 is an example basis complementary VT-drop ambipolar CNT FET logic gate shared bottom gate B and complementary top gates A and $\overline{A}$.

FIG. 3 is an example basis complementary VT-drop ambipolar CNT FET logic gate 300 with shared bottom gate 104 B and complementary top gates 102 A and $\overline{A}$. The basis complementary VT-drop ambipolar CNT FET logic gate 300 is shown schematically in FIG. 3, including a common semiconducting CNT FET 100, one bottom gate 104, two top gates 102, a high/low voltage supply node 302, e.g., two supply voltage rails, a voltage source voltage VDD 304, a ground 306 and one output node 308. Other amounts of bottom gates 104, top gates 102, voltage rails 302, output nodes 308, etc., can be used. The components form two dual-gate ambipolar CNT FETs 100 connected between the high/low voltage supply node 302 and the output node 308. There are two input signals, one (B) connected to the bottom gate 104 and the other (A) connected to the top gates 102 in an inverted and non-inverted form. The system is designed for CNT FETs 100 with ambipolar behavior centered on a non-zero gate-source voltage, and in some examples voltage VDD 304 is chosen as twice the voltage.

Each dual-gate ambipolar CNT FET 100 can be in a highly conductive "ON" state when both the top gates 102 and bottom gate 104 have the same binary voltage value, as explained previously. As the two CNT FETs 100 have equivalent bottom gate voltages and opposite top gate voltages, exactly one is ON at all times. The gates 102, 104 therefore determine the XNOR function, in Table II for a device with symmetric threshold voltages. The output voltage is dependent on the combination of inputs, as the pull-up (pull-down) FET provides a VT threshold voltage drop when both FET gate voltages are '1' ('0'). Only two ambipolar CNT FETs 100 are required to compute the XOR/XNOR function, far fewer than the eight required by CMOS and the four by the previous ambipolar FET logic family.

TABLE II

Basis Ambipolar CNT FET Binary Logic Gate States

| A | | B | | F | |
|---|---|---|---|---|---|
| Logic Value | Voltage | Logic Value | Voltage | Logic Value | Voltage |
| 0 | GND | 0 | GND | 1 | VDD |
| 0 | GND | 1 | VDD | 0 | GND |
| 1 | VDD | 0 | GND | 0 | VT |
| 1 | VDD | 1 | VDD | 1 | VDD-VT |

Ambipolar VT-Drop CNT FET Logic Circuits

Figure 4:
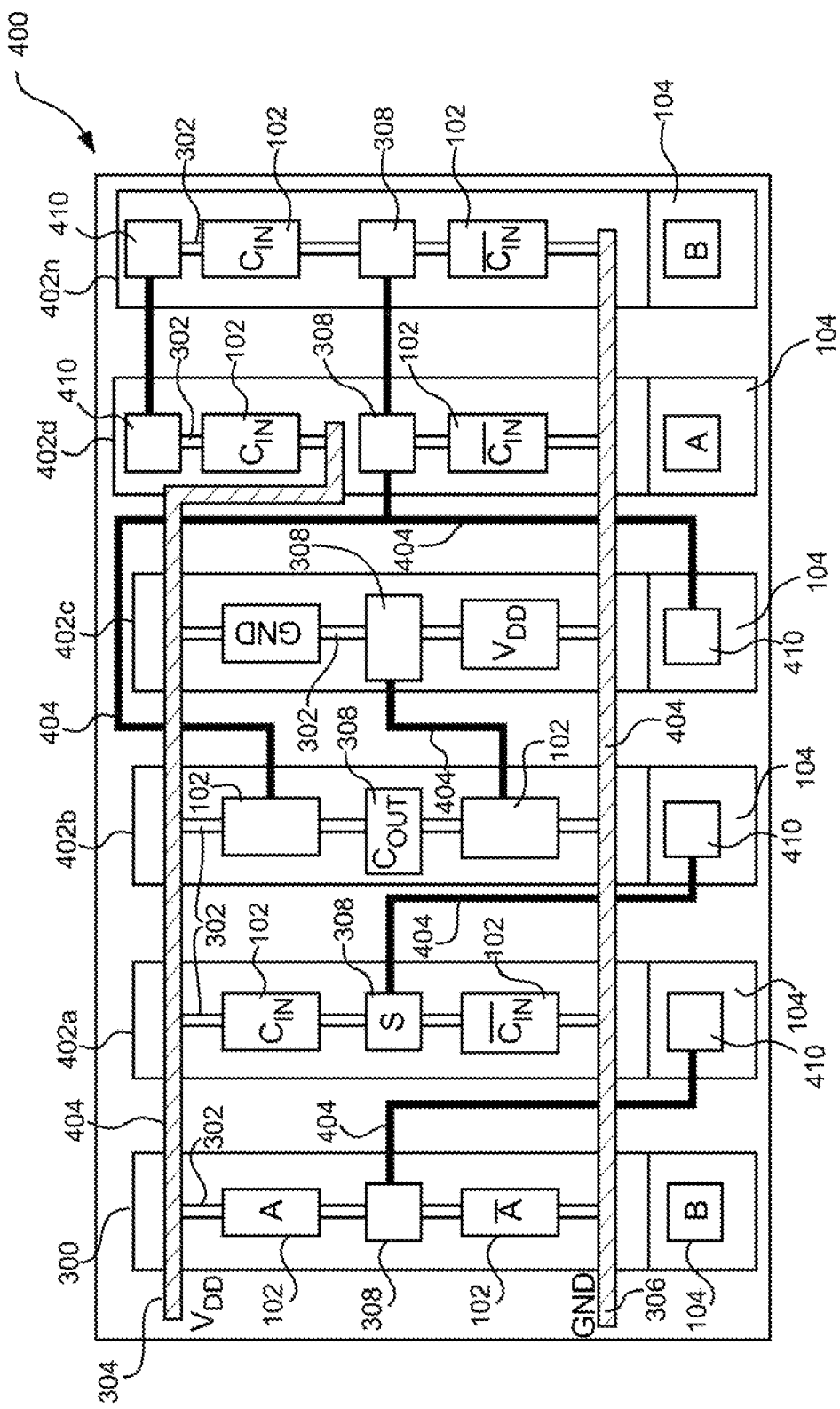
FIG. 4 is an example cascaded complementary VT-drop ambipolar CNT one-bit full adder with inputs A, B, and CIN, and outputs S and COUT.

FIG. 4 is an example cascaded complementary VT-drop ambipolar CNT one-bit full adder 400 with inputs A, B, and CIN, and outputs S and COUT. Analogous to CMOS, multi-FET pull-up and pull-down networks perform complex logic functions. The output voltage of one complementary VT-drop ambipolar CNT FET logic gate 300 can be used as the input voltage of other, enabling cascaded CNT FET circuits 402a-n. Inputs/outputs of the logic gate 300 and other CNT FET circuits 402a-n can connect with each other via electrically conducting traces 404, e.g., metal wire.

As an example, the one-bit full adder of FIG. 4 computes the sum function with the two left-most cascaded XNOR basis gates 402a, b. The sum output is used in concert with the outputs of the three right-most CNTs 402c-n to perform the carry-out operation. Conductive contacts 410 can connect the (vertical) CNT FETs to the (horizontal) conducting traces 404. In Table III, gate output voltages sufficiently close to the high/low voltage supply node 302 do not result in accumulating voltage drops when gates 102, 104 are cascaded. The circuitry for the adder 400 thus performs the full adder function with as few as twelve ambipolar CNT FETs 100.

TABLE III

Voltage and Truth Table for One-Bit Full Adder

| A | | B | | CIN | | Sum | | COUT | |
|---|---|---|---|---|---|---|---|---|---|
| Logic Value | Voltage | Logic Value | Voltage | Logic Value | Voltage | Logic Value | Voltage | Logic Value | Voltage |
| 0 | GND | 0 | GND | 0 | GND | 0 | GND | 0 | VT |
| 0 | GND | 0 | GND | 1 | VDD | 1 | VDD-VT | 0 | GND |
| 0 | GND | 1 | VDD | 0 | GND | 1 | VDD | 0 | GND |
| 0 | GND | 1 | VDD | 1 | VDD | 0 | VT | 1 | VDD |
| 1 | VDD | 0 | GND | 0 | GND | 1 | VDD | 0 | GND |
| 1 | VDD | 0 | GND | 1 | VDD | 0 | VT | 1 | VDD |
| 1 | VDD | 1 | VDD | 0 | GND | 0 | GND | 1 | VDD |
| 1 | VDD | 1 | VDD | 1 | VDD | 1 | VDD-VT | 1 | VDD-VT |

As only one double-gate FET is used for each pair of inputs in each pull-up or pull-down network, the logic family can require half as many FETs as compared to the previous ambipolar CNT logic. Furthermore, the VT-drop ambipolar CNT logic structure can require fewer inverted inputs than the previous full-swing ambipolar CNT logic, thus also presenting an advantage in terms of speed and the number of logic stages.

To ensure proper switching activity despite the reduced output voltage range, the logic family requires a larger supply voltage than the previous full-swing ambipolar CNT logic. The reduction in the number of logic stages counteracts the effect on power dissipation, as does the decrease in static current resulting from removal of the parallel pairs of OFF-state CNT FETs. Additionally, the use of a common bottom gate 104 for both FETs in each stage can simplify the fabrication process.

Figure 5:
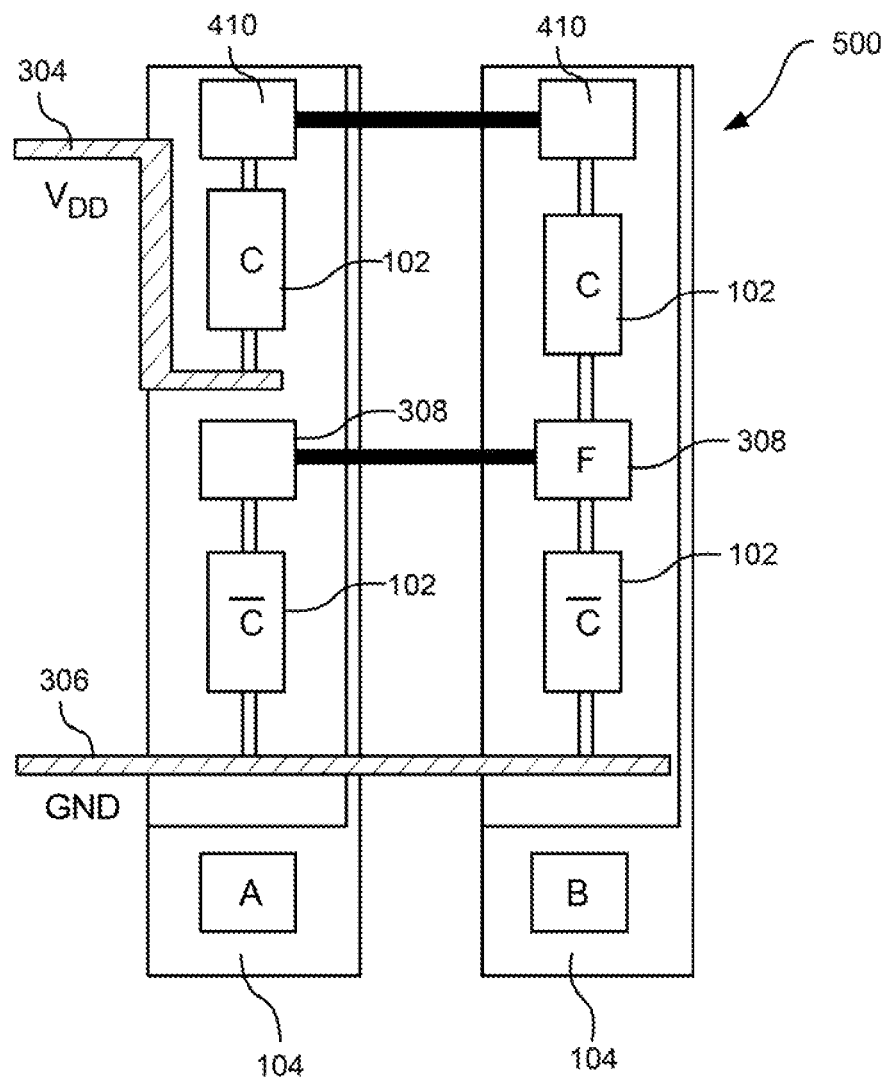
FIG. 5 is an example complementary VT-drop ambipolar CNT multi-input logic gate with output F and inputs A, B, and C.

FIG. 5 is an example complementary VT-drop ambipolar CNT FET multi-input logic gate 500 with output F and inputs A, B, and C. The parallel/series dual-gate CNTs 400*d*, *n*, the two right-most CNTs in FIG. 4, can perform functions other than XNOR.

Complementary VT-Drop Ambipolar CNT Logic Circuits: Efficient complementary VT-drop ambipolar CNT logic circuits can include multi-input and cascaded gates. As a useful example, a full adder includes just twelve ambipolar CNT FETs 100.

Multi-Input Gates

As in CMOS, complex pull-up and pull-down networks can be used to perform multi-input logic in a single gate. Complementary networks, as in the circuit of FIG. 5, ensure a deterministic output voltage. This circuit for a multi-input logic gate 500 can compute the function $$F=\overline{A \oplus C} \wedge \overline{B \oplus C}=(A \wedge B \wedge C) \vee (\overline{A} \wedge \overline{B} \wedge \overline{C}),$$

with a truth and voltage Table IV shown below. The series connection in the pull-up network causes a 2VT voltage drop, including a further increase in supply voltage VDD 304.

| Voltage and truth table IV for circuit of FIG. 5: | | | | | | | |
|---|---|---|---|---|---|---|---|
| A | | B | | C | | F | |
| Logic Value | Voltage | Logic Value | Voltage | Logic Value | Voltage | Logic Value | Voltage |
| 0 | 0 | 0 | 0 | 0 | 0 | 1 | $V_{DD}$ |
| 0 | 0 | 0 | 0 | 1 | $V_{DD}$ | 0 | $V_T$ |
| 0 | 0 | 1 | $V_{DD}$ | 0 | 0 | 0 | 0 |
| 0 | 0 | 1 | $V_{DD}$ | 1 | $V_{DD}$ | 0 | $V_T$ |
| 1 | $V_{DD}$ | 0 | 0 | 0 | 0 | 0 | 0 |
| 1 | $V_{DD}$ | 0 | 0 | 1 | $V_{DD}$ | 0 | $V_T$ |
| 1 | $V_{DD}$ | 1 | $V_{DD}$ | 0 | 0 | 0 | 0 |
| 1 | $V_{DD}$ | 1 | $V_{DD}$ | 1 | $V_{DD}$ | 1 | $V_{DD}$-2 VT |

The logic family can make efficient use of ambipolar CNTs to provide an exemplary 50%-75% decrease in device count, or other device counts, compared to previous ambipolar CNT FET logic structures. The advance comes at the cost of a VT drop at each logic stage, which fundamentally alters the circuit analysis and design. The VT drop does not prevent the cascading of logic gates, as sufficient supply voltage can be used to ensure proper transport behavior in the CNT FETs. The compact nature of the logic family provides impetus for further investigation with CNT FETs and other ambipolar nanodevices as a potential replacement for CMOS in next-generation computers.

A system can include a first logic gate, including in electrical communication a high/low voltage supply node, an output node, a first ambipolar device and a second ambipolar device, the first ambipolar device including two gates and the second ambipolar device including two gates. In some examples, the logic gate provides an XOR/XNOR function. The first ambipolar device and the second ambipolar device can combined into a single ambipolar device to include a total of three gates, e.g., in which one of the gates is shared. The first logic gate can be cascaded with a second logic gate, e.g., where the output node of the first logic gate is an input of the second logic gate. A plurality of logic gates can be cascaded, e.g., where the plurality of logic gates form an adder. Parallel or series dual-gate ambipolar devices can perform a function of the first logic gate. In some implementations, the ambipolar device comprises carbon nanotubes.

Applications of the systems, methods and/or logic can include one or more of high-performance computing and/or electronics, compact computing circuits, area-energy-delay-efficient computing. Advantages can include one or more of fully exploiting ambipolar transport, enabling efficient cascaded gates, requiring fewer devices for each function, fewer logic stages, less area, fewer stage delays, potential high speed and low power.

The systems and methods described above may be implemented in many different ways in many different combinations of hardware, software firmware, or any combination thereof. In one example, the systems and methods can be implemented with a processor and a memory, where the memory stores instructions, which when executed by the processor, causes the processor to perform the systems and methods. The processor may mean any type of circuit such as, but not limited to, a microprocessor, a microcontroller, a graphics processor, a digital signal processor, or another processor. The processor may also be implemented with discrete logic or components, or a combination of other types of analog or digital circuitry, combined on a single integrated circuit or distributed among multiple integrated circuits. All or part of the logic described above may be implemented as instructions for execution by the processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. A product, such as a computer program product, may include a storage medium and computer readable instructions stored on the medium, which when executed in an endpoint, computer system, or other device, cause the device to perform operations according to any of the description above. The memory can be implemented with one or more hard drives, and/or one or more drives that handle removable media, such as diskettes, compact disks (CDs), digital video disks (DVDs), flash memory keys, and other removable media.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various embodiments have been described, it can be apparent that many more embodiments and implementations are possible. Accordingly, the embodiments are not to be restricted.

We claim:

1. A system, comprising:
a logic gate, including an ambipolar device having a total of three separate gates; and
the ambipolar device including in electrical communication with a first gate, a second gate, a third gate, a high/low voltage supply node, and an output node, where the first gate, the second gate and the third gate are each separate gates sharing a same single common ambipolar component.

2. The system of claim 1, further including a first input signal and a second input signal, the first input signal connected with the first gate, the second input signal connected with the second gate, and an inverted form of the second input signal connected with the third gate.

3. The system of claim 1, wherein ambipolar behavior is centered on a non-zero gate-source voltage, and an input voltage is determined as twice the non-zero gate-source voltage.

4. The system of claim 1, wherein the ambipolar device includes two dual-gate ambipolar field effect transistors connected between the high/low voltage supply node and the output node.

5. The system of claim 4, wherein the dual-gate ambipolar field effect transistors are in a highly conductive "ON" state when both gates of the dual-gate have a same binary voltage value.

6. The system of claim 5, wherein each dual-gate ambipolar field effect transistor includes equivalent first gate voltages and opposite second gates voltages, and exactly one dual-gate ambipolar field-effect transistor is ON at all times.

7. The system of claim 6, wherein the logic gate computes an XOR/XNOR function for symmetric threshold voltages.

8. The system of claim 7, wherein an output voltage is dependent on a combination of inputs, as each dual-gate ambipolar field effect transistor provides a threshold voltage drop when both pull-up field effect transistor gate voltages are one or when both pull-down field effect transistor gate voltages are zero.

9. The system of claim 8, wherein only two ambipolar field effect transistors are used to compute the XOR/XNOR function.

10. The system of claim 4, wherein the first gate is formed by electrically connecting one of the gates from each of the two dual-gate ambipolar field effect transistors as the first gate, and other gate from each of the two dual-gate ambipolar field effect transistors are the second gate and the third gate, respectively, on the ambipolar device.

11. The system of claim 1, wherein the logic gate is cascaded with other logic gates to form an adder.

12. The system of claim 1, wherein the same single ambipolar component comprises a semiconducting carbon nanotube.

13. The system of claim 1, wherein the first gate comprises a back gate, the second gate comprises a top gate and the third gate comprises a top gate.

14. The system of claim 1, further including parallel/series dual-gate ambipolar devices within pull-up and pull-down networks to perform a function of the logic gate.

15. A system, comprising:
a first logic gate, including a high/low voltage supply node, an output node wherein the first logic gate is a single device having a total of three separate gates, the first logic gate is formed by combining a first dual-gate ambipolar device and a second dual-gate ambipolar device.

16. The system of claim 15, where the first logic gate provides an XOR/XNOR function.

17. The system of claim 15, where the first and the second dual-gate ambipolar devices each comprise two gates and where one of the two gates from each of the first and the second dual-gate ambipolar devices are electrically connected together to form a first gate, while other gate from each of the first and the second dual-gate ambipolar devices are a second gate and a third gate, respectively, the first gate, the second gate and the third gate are each separate gates within the first logic gate.

18. The system of claim 15, where the first logic gate is cascaded with a second logic gate, and the output node of the first logic gate is an input of the second logic gate.

19. The system of claim 18, where a plurality of logic gates are cascaded.

20. The system of claim 19, where the plurality of logic gates forms an adder.

21. The system of claim 15, further including parallel/series dual-gate ambipolar devices to perform a function of the first logic gate.

22. The system of claim 15, where the ambipolar device comprises carbon nanotubes.

23. A system, comprising:
a logic gate, including an ambipolar device having a total of three separate gates; and
the ambipolar device including in electrical communication with a first gate, a second gate, a third gate, a high/low voltage supply node, and an output node,
where the first gate, the second gate, and the third gate include separate gates sharing a same single common ambipolar component,
where a first input signal connected with the first gate, a second input signal connected with the second gate, and an inverted form of the second input signal connected with the third gate.

24. A system, comprising:
a logic gate, including an ambipolar device having a total of three separate gates; and
the ambipolar device including in electrical communication with a first gate, a second gate, a third gate, a high/low voltage supply node, and an output node,
where the first gate, the second gate, and the third gate include separate gates sharing a same single common ambipolar component, wherein ambipolar behavior is centered on a non-zero gate-source voltage, and an input voltage is determined as twice the non-zero gate-source voltage.

25. A system, comprising:
a logic gate, including an ambipolar device having a total of three separate gates; and
the ambipolar device including in electrical communication with a first gate, a second gate, a third gate, a high/low voltage supply node, and an output node,
where the first gate, the second gate, and the third gate are each separate gates sharing a same single carbon nanotube.

26. The system of claim 25, wherein the ambipolar device includes two dual-gate ambipolar field effect transistors connected between the high/low voltage supply node and the output node.

27. The system of claim 26, wherein the dual-gate ambipolar field effect transistors are in a highly conductive "ON" state when both gates of the dual-gate have a same binary voltage value.

28. The system of claim 27, wherein each dual-gate ambipolar field effect transistor includes equivalent first gate voltages and opposite second gates voltages, and exactly one dual-gate ambipolar field-effect transistor is ON at all times.

29. The system of claim 28, wherein the logic gate computes an XOR/XNOR function for symmetric threshold voltages.

30. The system of claim 29, wherein an output voltage is dependent on a combination of inputs, as each dual-gate ambipolar field effect transistor provides a threshold voltage drop when both pull-up field effect transistor gate voltages are one or when both pull-down field effect transistor gate voltages are zero.

31. The system of claim 30, wherein only two ambipolar field effect transistors are used to compute the XOR/XNOR function.

* * * * *